(12) United States Patent
Rae et al.

(10) Patent No.: US 10,168,228 B2
(45) Date of Patent: *Jan. 1, 2019

(54) THERMOCOUPLE APPARATUS AND METHOD

(71) Applicant: Cambridge Enterprise Limited, Cambridge (GB)

(72) Inventors: Cathie Rae, Cambridge (GB); Michele Scervini, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/618,217

(22) Filed: Jun. 9, 2017

(65) Prior Publication Data

US 2017/0363480 A1 Dec. 21, 2017

Related U.S. Application Data

(63) Continuation of application No. 13/638,906, filed as application No. PCT/GB2011/000506 on Mar. 31, 2011, now Pat. No. 9,702,764.

(51) Int. Cl.
*G01K 7/02* (2006.01)
*G01K 7/12* (2006.01)
(Continued)

(52) U.S. Cl.
CPC .............. *G01K 7/02* (2013.01); *B21D 7/00* (2013.01); *G01K 1/08* (2013.01); *H01L 35/20* (2013.01)

(58) Field of Classification Search
CPC .. G01K 7/02; G01K 1/14; G01K 1/08; G01K 7/00; G01K 1/12; G01K 1/00; G01K 7/06; G01K 7/12; H01L 27/16
See application file for complete search history.

(56) References Cited

U.S. PATENT DOCUMENTS 1,587,994 A 6/1926 Spitzley
1,704,087 A 3/1929 Hybinette
(Continued)

FOREIGN PATENT DOCUMENTS

CA 1238116 A 6/1988
CN 85104121 A 10/1986
(Continued)

OTHER PUBLICATIONS

Christie, W.H., et al., "Ion Microprobe Investigation of Decalibrated Chromel Versus Alumel Thermocouples: A Quantitative SIMS Analysis Using Indexed Sensitivity Factors and Oxygen Flooding," Applications of Surface Science, North-Holland Publishing Company, 1979, pp. 329-347, vol. 3.
(Continued)

*Primary Examiner* — Gail Kaplan Verbitsky
(74) *Attorney, Agent, or Firm* — Banner & Witcoff, Ltd.

(57) ABSTRACT

In a thermocouple, a pair of thermoelements extend within a protective sheath. The thermoelements are spaced from the sheath by an insulator. The sheath comprises an outer sheath formed from a metal alloy adapted to provide mechanical support and corrosion resistance during use of the thermocouple, typically at elevated temperature. The sheath further comprises an inner sheath positioned between the outer sheath and the thermoelements and formed from a nickel-based alloy containing less than 10 wt % Cr, to prevent diffusion of Cr and/or Mn from the outer sheath to the thermoelements.

22 Claims, 3 Drawing Sheets

(51) Int. Cl.
*G01K 7/14* (2006.01)
*H01L 35/20* (2006.01)
*B21D 7/00* (2006.01)
*G01K 1/08* (2006.01)

(56) References Cited

U.S. PATENT DOCUMENTS

| | | |
|---|---|---|
| 2,587,391 A | 2/1952 | Seaver |
| 2,691,690 A | 10/1954 | Poch |
| 2,757,220 A | 7/1956 | Carter |
| 3,010,480 A | 11/1961 | Ragsdale |
| 3,297,818 A | 1/1967 | McCleery |
| 3,329,534 A | 7/1967 | Adler |
| 3,463,674 A | 8/1969 | Black |
| 3,539,400 A | 11/1970 | Pustell |
| 3,615,324 A * | 10/1971 | Gordon .................. C03C 29/00 |
| | | 174/102 P |
| 3,795,601 A | 3/1974 | Brewer |
| 3,891,467 A | 6/1975 | Tyler |
| 3,975,212 A | 8/1976 | Haupin et al. |
| 4,060,094 A | 11/1977 | McAinsh |
| 4,239,557 A | 12/1980 | Thellmann et al. |
| 4,277,886 A | 7/1981 | Bauer et al. |
| 4,778,537 A | 10/1988 | Thom et al. |
| 4,834,807 A | 5/1989 | Burley |
| 5,010,316 A | 4/1991 | Burley |
| 5,030,294 A | 7/1991 | Burley |
| 5,043,023 A | 8/1991 | Bentley |
| 5,275,670 A | 1/1994 | Smialek et al. |
| 5,464,485 A | 11/1995 | Hall, Jr. |
| 5,747,727 A | 5/1998 | Sawada et al. |
| 5,917,150 A | 6/1999 | Hampton et al. |
| 5,999,081 A | 12/1999 | Hannigan et al. |
| 6,830,374 B1 | 12/2004 | Gray |
| 7,632,384 B1 | 12/2009 | Redey et al. |
| 9,733,131 B2 * | 8/2017 | Ewing ...................... G01K 7/02 |
| 2007/0195859 A1 * | 8/2007 | Krishnamurthy ........ G01K 1/14 |
| | | 374/208 |
| 2008/0205483 A1 | 8/2008 | Rempe et al. |
| 2009/0297698 A1 | 12/2009 | Zinn et al. |
| 2014/0153612 A1 * | 6/2014 | Yonekura .................. G01K 7/02 |
| | | 374/179 |
| 2014/0376593 A1 * | 12/2014 | Ewing ...................... G01K 7/02 |
| | | 374/179 |
| 2018/0015592 A1 * | 1/2018 | Can .......................... C22C 26/00 |

FOREIGN PATENT DOCUMENTS

| | | |
|---|---|---|
| CN | 201038192 Y | 3/2008 |
| CN | 101493359 A | 7/2009 |
| CN | 201340305 Y | 11/2009 |
| DE | 3636468 C1 | 9/1987 |
| DE | 88/02106 U1 | 4/1988 |
| EP | 0161986 A2 | 11/1985 |
| EP | 0322992 A2 | 7/1989 |
| GB | 994235 A | 6/1965 |
| GB | 2107516 A | 4/1983 |
| GB | 2159663 A | 12/1985 |
| JP | S57-119228 A | 7/1982 |
| JP | 8082557 | 9/1994 |
| JP | 2008-261686 A | 10/2008 |

OTHER PUBLICATIONS

Jul. 14, 2011—(WO) ISR—App. No. PCT/GB11/00506.
Jul. 14, 2011—(WO) Written Opinion—App. No. PCT/GB11/00506.
Oct. 2, 2012—(WO) IPRP and Written Opinion—App. No. PCT/GB11/00506.

* cited by examiner

THERMOCOUPLE APPARATUS AND METHOD

CROSS-REFERENCE TO RELATED APPLICATION

This application is a continuation to U.S. patent application Ser. No. 13/638,906 filed Jun. 10, 2013, entitled THERMOCOUPLE APPARATUS AND METHOD, which is the U.S. national stage application of International Patent Application No. PCT/GB2011/000506, filed Mar. 31, 2011, which claims priority to Great Britain Patent Application No. 1005509.3, filed Mar. 31, 2010, the disclosures of each of which are incorporated by reference in their entirety.

BRIEF SUMMARY

The invention relates to a thermocouple apparatus and method, and in particular to a Mineral Insulated Metal Sheathed (MIMS) thermocouple.

MIMS thermocouples are widely used in industry and certain types have become popular as industry standards. For high-temperature applications, these include Type K and Type N thermocouples. However, at elevated temperatures above about 1000 C, conventional MIMS thermocouples suffer from two problems, namely oxidation (when used in oxidizing atmospheres) and drift, i.e., a change of the measured voltage with time during exposure of the thermocouple to high temperatures, which limits the reliability of temperature measurement. For conventional nickel-based MIMS thermocouples, drift typically worsens above about 1000 C. Temperature measurement at temperatures above about 1000 C then disadvantageously requires the use of much more expensive thermocouples made of noble metals such as platinum.

In a MIMS thermocouple, positive and negative thermoelements are contained within a tubular metal sheath, and insulated from each other and from the sheath by a compacted ceramic or mineral material (except at the thermocouple tip where the thermoelements are joined together and may, in some thermocouple designs, be in electrical contact with the sheath). The sheath is designed to provide oxidation resistance, i.e., to prevent oxidation of the thermoelements, but it can affect the drift behaviour of the thermocouple. In particular, alloys which optimise the oxidation resistance of the sheath commonly contain manganese, and it is known that migration of manganese from the sheath to the thermoelements due to diffusion at elevated temperature can change the Seebeck coefficient of the thermoelements and so cause drift. This problem is described, for example, in U.S. Pat. No. 5,043,023. This is a particular problem with nickel-based thermocouples, and undesirably limits the high-temperature performance of these thermocouples.

In a first aspect, the invention may thus provide a thermocouple in which a thermoelement extends within a metal outer sheath, and a nickel-based inner sheath containing less than 10 wt % of chromium is positioned between the thermoelement and the metal outer sheath.

The term nickel-based means that the inner sheath comprises a nickel alloy, which contains nickel as the largest wt % component of the alloy, and is preferably more than 50 wt % Ni.

Advantageously, the metal outer sheath may serve to protect the thermoelement, and other components of the thermocouple within the outer sheath, from the environment during operation of the thermocouple. For example, if the thermocouple is for use in an oxidising environment, then the outer sheath may advantageously protect the thermoelement from oxidation. This is a common requirement, for example for thermocouples operating in air at elevated temperatures. For thermocouples operating in other environments, the outer sheath may advantageously be designed to protect the thermoelement from those environments during operation.

It is known, as described above, that manganese contained in the outer sheath of a conventional thermocouple may contaminate thermoelements and cause drift. In addition, the inventor has now appreciated that chromium contained in the outer sheath of a conventional thermocouple may also contaminate thermoelements and cause drift. Many conventional sheaths for MIMS thermocouples are based on nickel-chromium alloys and therefore the inventor has identified a significant problem. In practice, nickel-chromium alloys have properties which are highly desirable for thermocouple sheaths (for example, they show high-oxidation resistance and are mechanically tough), but the inventor has appreciated that use of these materials may limit the high temperature performance of thermocouples by causing drift, even though they may provide satisfactory oxidation protection. In practice, it may not be possible to exclude chromium from a thermocouple sheath alloy if adequate oxidation resistance is to be achieved.

In order to increase the maximum operating temperature of a conventional MIMS thermocouple from, say, 1000 C to 1200 C or more, it is necessary both to ensure that the thermocouple is adequately protected from the environment (usually from oxidation) and that drift is prevented. A good environmental (oxidation) resistance may be achieved by using a conventional oxidation-resistant alloy for the sheath, but in prior art thermocouples, contamination of the thermoelements by alloying elements in such alloys has then limited the maximum operating temperature by causing unacceptable drift. The diffusion barrier provided by the inner sheath of the present invention may advantageously enable the maximum operating temperature of a MIMS thermocouple to be increased by preventing or reducing drift. Advantageously, embodiments of the invention may allow operation of a MIMS thermocouple at 1100 C or more, or 1200 C or more. This may advantageously give operating temperature ranges from 1100 C or 1150 C or 1200 C up to 1250 C or 1300 C or 1350 C for example.

In various aspects of the invention, a number of materials are proposed for the inner sheath. These include a pure nickel sheath, of greater than 99 wt % nickel or preferably greater than 99.5 wt % nickel. An example would be Nickel 270 (UNS N02270/W. Nr. 2.4050). Alternatively, a nickel-based sheath may be used which does not contain chromium, or contains chromium at less than 10 wt %, or less than 9 wt %, preferably less than 5 wt % and particularly preferably less than 3 wt %, and particularly preferably less than 1 wt %. In a specific embodiment, a nickel-based sheath may be used that contains chromium at less than 0.1 wt %.

A further preferred alternative is a nickel-based sheath which does not contain manganese or has a manganese concentration lower than 0.2 wt % or 0.1 wt %, and also does not contain chromium or has a chromium concentration less than 10 wt %, less than 9 wt %, less than 5 wt % or less than 3 wt %.

A further aspect of the invention may advantageously provide a thermocouple comprising a nickel-based inner sheath which does not contain manganese or has a manganese concentration lower than 0.2 wt %, or preferably lower than 0.1 wt %, or particularly preferably lower than 0.01 wt %. In this aspect of the invention the inner sheath may comprise 10 wt % Chromium (Cr) or more. This inner sheath may be used where contamination of the thermoelement(s) with Magnesium (Mn) is to be avoided but where a higher concentration of Cr in the inner sheath, and therefore the possibility of Cr contamination of the thermoelements, may be acceptable.

Each of the inner sheaths described above is formed using a nickel-based alloy comprising a limited concentration of Cr and/or Mn. As described above, the term nickel-based may mean that the alloy contains a higher content (in wt %) of Nickel (Ni) than of any other element. In view of this, the skilled person would be able to fabricate inner sheaths embodying the invention, taking into account the thermal and mechanical properties required for the inner sheath of a thermocouple designed for operation at 1100 C or above, or between 1100 C and 1200 C or even 1300 C or 1350 C.

In a first preferred embodiment, nickel may form the whole of the balance of the alloy composition except for the Cr and/or Mn content described above, or Ni may form at least 80%, 90%, 95% or 98% of the balance of the alloy composition. Alternatively, the nickel content of the alloy may be greater than 50 wt %, 60 wt %, 70 wt %, 80 wt %, 85 wt % or 90 wt %.

Where Ni and Cr and/or Mn do not constitute the only components of the alloy, the balance may comprise one or more of the following:

Fe and/or Co, each up to 49 wt %, or preferably up to 40 wt %, 30 wt %, 20 wt % or 10 wt %;
Mo up to 25 wt %, or preferably up to 15 wt %, 10 wt % or 5 wt %;
W up to 15 wt %, or preferably up to 10 wt % or 5 wt %;
Nb, Ta, V, Ti, Al, Si, Mg, Cu and/or Hf each up to 5 wt %, or preferably up to 3 wt %, 2 wt % or 1 wt, up to a cumulative maximum for these elements of 15 wt %, or preferably up to 10 wt % or 5 wt %.

In all cases, as the skilled person would appreciate, the alloy may comprise other trace elements or contaminants at acceptably low concentrations in known manner without affecting the performance of the alloy.

In an embodiment of the invention, a thermocouple may comprise a pair of thermoelements extending within an inner sheath, with the outer sheath encircling the inner sheath. The inner sheath and the outer sheath may be in the form of a pair of concentric or coaxial tubes, which may be in contact with each other. In a preferred embodiment, the inner sheath and the outer sheath may take the form of a double-walled sheath structure, the inner and outer sheaths optionally being formed simultaneously by coextrusion or swaging.

In alternative embodiments, the inner sheath and the outer sheath may be spaced from one another, and optionally insulated from one another.

A thermocouple comprises two or more thermoelements and in aspects of the invention one, two or more thermoelements may extend within the same inner sheath.

In another embodiment, two thermoelements may each extend within one of two separate inner sheaths. In this structure, each inner sheath may advantageously provide a diffusion barrier for its respective thermoelement, not only preventing diffusion of elements from the outer sheath, but also preventing contamination of one thermoelement by diffusion of elements from the other thermoelement.

In embodiments of the invention the thermocouple is preferably a nickel based thermocouple. In such a thermocouple the thermoelements are nickel-based thermoelements, or are formed of Ni alloys, that is alloys which contain Ni as the largest wt % component. Often such alloys may comprise more than 50 wt % Ni.

In each case, the provision of the inner sheath as a diffusion barrier between the outer sheath and one or more thermoelements may advantageously enable the design of the outer sheath to be optimised for environmental protection of the thermocouple, without the constraint of avoiding the use of manganese and/or chromium in the outer sheath, which cause thermoelement contamination and drift at elevated temperatures due to the effect of these contaminants in changing the Seebeck coefficient of the thermoelements.

A conventional MIMS thermocouple such as a Type K or Type N thermocouple may be usable to measure temperatures up to about 1000 C, but if conventional thermocouple sheaths are used, these thermocouples typically suffer from increasing amounts of drift at higher temperatures, such as 1100 C, 1200 C, or 1300 C. It may be possible to fabricate sheaths for MIMS thermocouples using conventional alloys (such as Inconel 600) to provide oxidation resistance at these higher temperatures but these alloys contain elements which then lead to contamination of the thermoelements at temperatures above about 1000 C, causing drift. Inconel 600 is a commonly-used material for conventional thermocouple sheaths, which contains up to 1 wt % Mn and usually contains between 0.3 wt % and 0.5 wt % Mn. Provision of a diffusion barrier in the form of an inner sheath, according to the aspects of the invention described, may advantageously overcome the problem of thermocouple drift when high-temperature-resistant alloys (such as Inconel 600) are used for an outer sheath and enable operation of thermocouples such as Type K or Type N thermocouples, or other thermocouples, including in particular nickel-based thermocouples, at or above higher temperatures, such as 1100 C, 1200 C or 1300 C.

The thickness of the inner sheath needs to be sufficient for the sheath to function as a diffusion barrier or contamination barrier. For example, the sheath thickness may be about 300 micrometers.

The or each thermoelement in each embodiment of the invention is electrically insulated from the or each inner sheath and each other thermoelement, at least along the length of the thermocouple, as required for functionality of the thermocouple. For example, an insulating material may space and insulate the or each thermoelement from the or each inner sheath. For the avoidance of doubt, this reference and other references in this document to the thermoelement(s) being spaced and/or insulated from the inner sheath refer to the length of the thermocouple, or thermocouple wire, excluding the thermocouple tip. At the thermocouple tip, thermoelements of the thermocouple are joined together, in electrical contact, and in some thermocouple designs the thermoelements may be electrically connected to the outer and/or the inner sheath(s) at the thermocouple tip. For example, in a thermocouple having an ungrounded configuration, the thermoelements may be connected to each other but not to the inner or outer sheath at the thermocouple tip, while in a grounded configuration the thermoelements are electrically connected to the outer and/or the inner sheaths at the thermocouple tip, and the respective inner and/or outer sheaths may be electrically connected to ground or earth.

In implementations of the invention, the outer sheath may be fabricated from any suitable material, without needing to avoid elements which may contaminate the thermoelements. The outer sheath may be nickel-based, or may be based on some other material. In conventional MIMS thermocouples, the sheaths are fabricated by conventional methods for tube fabrication, such as extrusion and/or drawing. In embodiments of the present invention, the inner and outer sheaths may similarly be fabricated by conventional methods for tube fabrication. In a similar way to a conventional MIMS thermocouple, an assembly of the inner and outer sheaths, the thermoelements and the insulating material (such as a ceramic or mineral material) can then be extruded or swaged down to a required size, or diameter, to form a MIMS cable. During this process, the thermoelements and insulation may be fabricated in the same way as for a conventional thermocouple, as the skilled person would appreciate.

To form a thermocouple, currently the end of a length of MIMS cable is usually crimped and welded (TIG welded usually) so that a sealed end is produced. This straightforward method applied to a double sheath thermocouple embodying the invention may result locally at the tip in an alloy whose concentration is lower in chromium (and for this reason less oxidation resistant) because of mixing between the low Cr content inner sheath and higher Cr content outer sheath. Three possible sealing strategies to solve this problem are as follows:

Removal of the inner sheath at the end to be sealed by drilling and sealing of the outer sheath with standard prior art technology. Once the MIMS cable has been cut, at its open end a drill or cutting tool of diameter equal to the external diameter of the inner sheath can be used to remove a predetermined length of the inner sheath, leaving only the outer sheath at the end of the cable. An annular drill or cutting tool may be used to prevent damage to the ends of the thermoelements within the sheath. The end portion of the outer sheath can then be, for example, crimped and welded without affecting its alloy composition.

Using a filler metal with higher Cr content than the outer sheath: a small volume of the filler metal is located, or inserted, in the gap at the open end of the MIMS cable and then the end of the MIMS cable is welded. The composition and mass of the filler metal are chosen to compensate for the mixing between the lower Cr content inner sheath and the higher Cr content outer sheath.

Crimping of the inner sheath and welding of the inner sheath followed by sealing of the outer sheath. This may involve crimping of the outer sheath and welding with lower power to achieve welding of the outer sheath but not remelting of the inner sheath. Alternatively, a filler metal may be provided before welding of the outer sheath with lower power to achieve welding of the outer sheath and filler metal but not remelting of the inner sheath.

In the embodiments of the invention described above, in which an assembly of inner and outer sheaths is formed into a MIMS cable by extrusion and/or drawing and/or swaging, the inner and outer sheaths may typically extend along the entire length of a thermocouple. In many cases this is satisfactory and provides an effective way to fabricate thermocouples, but to achieve the benefit of the inner sheath in preventing contamination of the thermoelements by diffusion of material from the outer sheath, in an alternative embodiment it may only be necessary for the inner sheath to extend along the portion of the thermocouple which is to be exposed to high temperatures during use.

It may be noted that in some of the techniques described above for sealing an end of a thermocouple cable, a small portion of the thermoelements may not be shielded by the inner sheath from the outer sheath at the end of the thermocouple. For example if an end portion of the outer sheath is removed and the end of the outer sheath is crimped and welded, or if a filler metal (such as a high Cr-content filler metal) is provided and the inner and outer sheaths are crimped and welded at the same time, then the inner sheath may not be continuous or may have an open end. In that case the portions of the thermoelements at or near to the end of the thermocouple may be disadvantageously not entirely shielded by the inner sheath. In practice, this is unlikely to have a significant effect on the efficacy of the inner sheath as all of the length of the thermoelements extending within the portion of the thermocouple exposed to high temperature during use is shielded by the inner sheath except for a small portion at the thermocouple tip.

As the operating temperature of a MIMS thermocouple is increased above about 1000 C, the oxidation resistance provided by the sheath may no longer be adequate. A further aspect of the invention therefore provides that at least a portion of the outer surface of the sheath may be coated with an intermetallic or coated using chromizing. Advantageously, the intermetallic may be a nickel-aluminide or platinum-doped nickel-aluminide. The coating may preferably only be applied to the portion of the thermocouple sheath which will be exposed to high temperatures.

For example, in a preferred embodiment of the invention a thermocouple comprising an outer sheath and an inner sheath (functioning as a contamination barrier as described above) may be allowed to operate at a still higher temperature if at least a portion of the outer surface of the outer sheath is coated with an intermetallic or coated using chromizing as described above.

Although applying a temperature-resistant coating to the outer sheath of a thermocouple comprising an outer sheath and an inner sheath may thus be particularly advantageous, this aspect of the invention may also be used to enhance the performance of a sheath of a thermocouple which does not comprise an inner sheath, but which only comprises a single sheath. For example, if an intermetallic coating or a coating obtained by chromizing is to be used, then an alloy for a sheath may be selected which does not contain elements that contaminate the thermoelements at a proposed operating temperature, but which does not provide adequate environmental protection at that proposed operating temperature. For example, any of the alloys described above for fabricating the inner sheath of the thermocouple according to the previous aspects of the invention could be used. The environmental protection (e.g., oxidation resistance) provided by the sheath may then be enhanced by coating at least a portion of the outer surface of the sheath (preferably the portion of the outer surface which will be exposed to high temperatures during use of the thermocouple) with an intermetallic or using chromizing, such that the coated sheath does provide adequate environmental protection at the proposed operating temperature. In this way, a thermocouple capable of operating at elevated temperatures may be provided, such as a temperature at or above 1100 C, 1200 C, 1300 C or even 1350 C.

A specific embodiment is directed to a thermocouple, in which a thermoelement extends within an outer sheath, comprising an inner sheath positioned between the thermoelement and the outer sheath, in which the inner sheath is adapted to prevent diffusion of contaminants which if absorbed by the thermoelement would change its Seebeck coefficient, from the outer sheath to the thermoelement during exposure of the thermocouple to elevated temperatures. In a further specific embodiment, the inner sheath of the thermocouple is a nickel-based inner sheath containing less than 10 wt % of chromium.

Embodiments of the invention may be used in any industrial temperature measurement application suitable for thermocouples, such as gas turbine, high-temperature process control, furnace temperature control and so on. Advantageously, however, aspects of the invention may enable conventional types of thermocouple, such as Type K and Type N thermocouples, to operate at higher temperatures than previously.

BRIEF DESCRIPTION OF THE DRAWINGS

Specific embodiments of the invention will now be described by way of example, with reference to the accompanying drawings, in which.

SPECIFIC EMBODIMENTS AND BEST MODE OF THE INVENTION

Figure 1A:
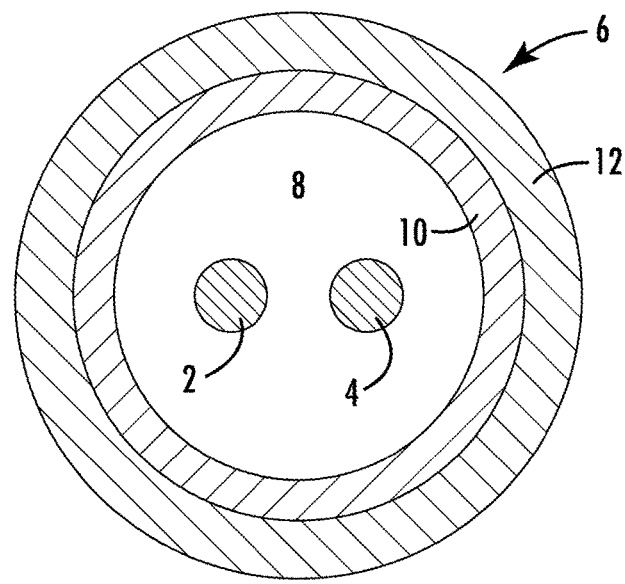
FIG. 1A is a schematic transverse section of a thermocouple according to a first embodiment of the invention.
Figure 1B:
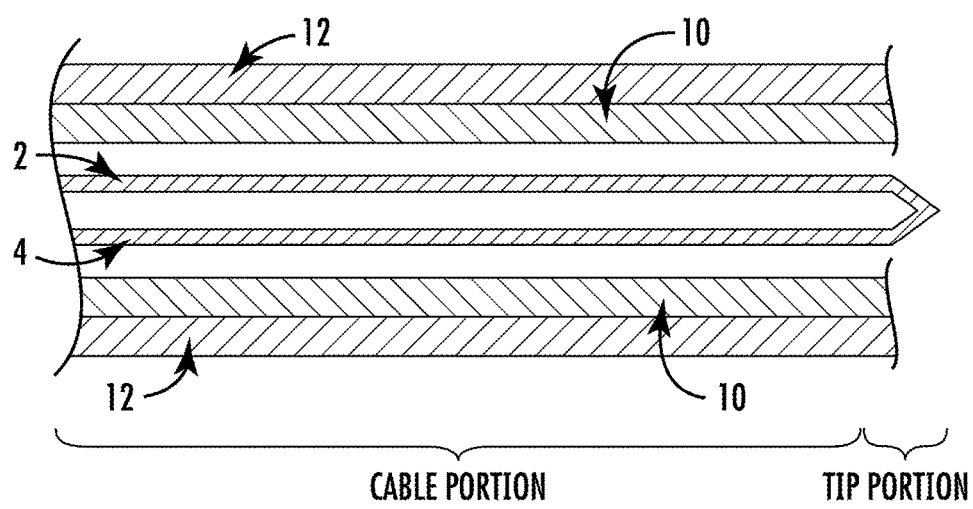
FIG. 1B is a schematic longitudinal section of the thermocouple according to the first embodiment of the invention, schematically showing the tip portion of the thermocouple.

FIGS. 1A and 1B are a transverse section and longitudinal section, respectively, of a thermocouple comprising two thermoelements 2, 4 extending within a composite sheath 6. The thermoelements are as in a conventional thermocouple, such as a Type K or Type N thermocouple. Along the length of the thermocouple, the thermoelements are insulated from each other and from the inner surface of the sheath by an insulating ceramic material 8, in the same way as in a conventional thermocouple.

The sheath is tubular and comprises an inner sheath 10 and an outer sheath 12. The outer sheath is of a conventional oxidation-resistant alloy such as Inconel 600, but may be of any conventional environment-resisting alloy. The inner sheath is of nickel-based alloy 270 (Nickel 270), but may be of any of the nickel-based compositions described above. The thermocouple is intended for operation at elevated temperature, such as above 1000 C. In this temperature range, in a conventional thermocouple the manganese and chromium content in the Inconel 600 would cause contamination of the thermoelements and consequently cause drift. In the embodiment, the inner sheath provides a diffusion barrier and prevents contamination of the thermoelements by either the manganese or chromium in the outer sheath.

The outer sheath is of similar dimensions to a conventional thermocouple sheath, both in terms of diameter and thickness. The inner sheath is between 300 and 500 micrometers thick.

Figure 2A:
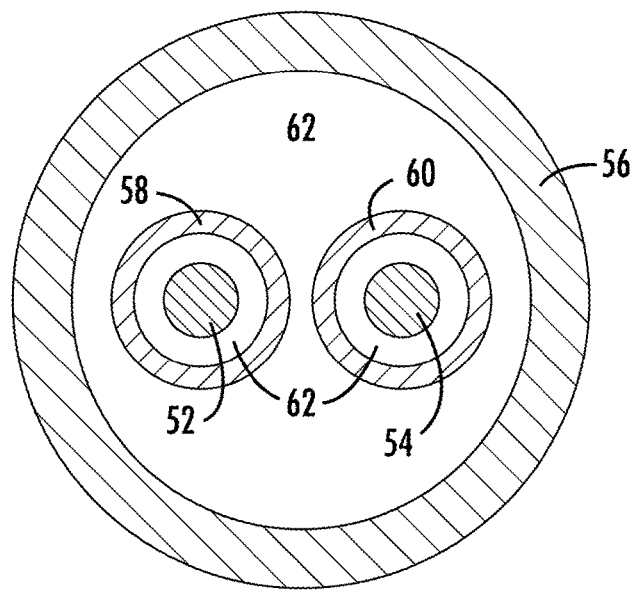
FIG. 2A is a schematic transverse section of a thermocouple according to a second embodiment of the invention.
Figure 2B:
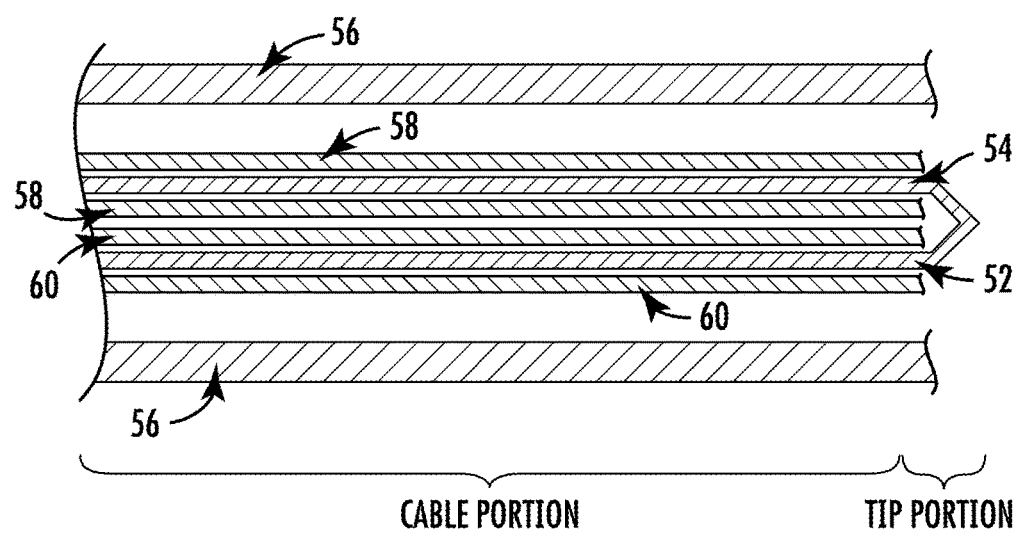
FIG. 2B is a schematic longitudinal section of the thermocouple according to the second embodiment of the invention, schematically showing the tip portion of the thermocouple.

FIGS. 2A and 2B are a transverse section and longitudinal section, respectively, of a thermocouple comprising two thermoelements 52, 54 extending within an outer sheath 56. Each thermoelement is contained within a respective inner sheath 58, 60. Along the length of the thermocouple, each thermoelement is insulated from its respective inner sheath, and each inner sheath is insulated from the other inner sheath and from the outer sheath, by an insulating ceramic material 62. The materials of the thermoelements, the inner and outer sheaths and the insulating material may be the same as in the first embodiment.

As in the first embodiment, the inner sheaths provide a contamination barrier to prevent contamination of the thermoelements by elements such as manganese and chromium in the outer sheath. In addition, each thermoelement is separated from the other thermoelement by the inner sheaths, and so any contamination of one thermoelement by diffusion of elements from the other is prevented.

Figure 3A:
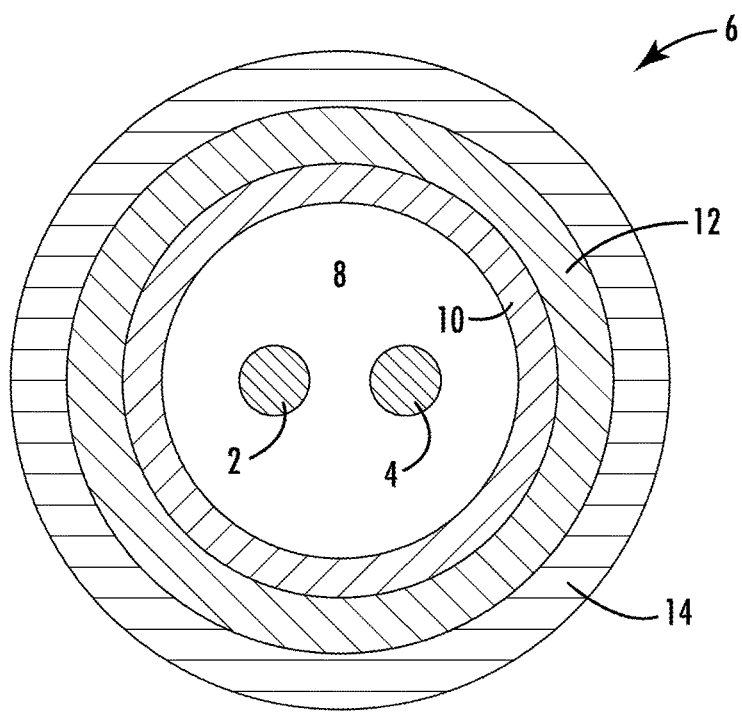
FIG. 3A is a schematic transverse section of a thermocouple according to a third embodiment of the invention.
Figure 3B:
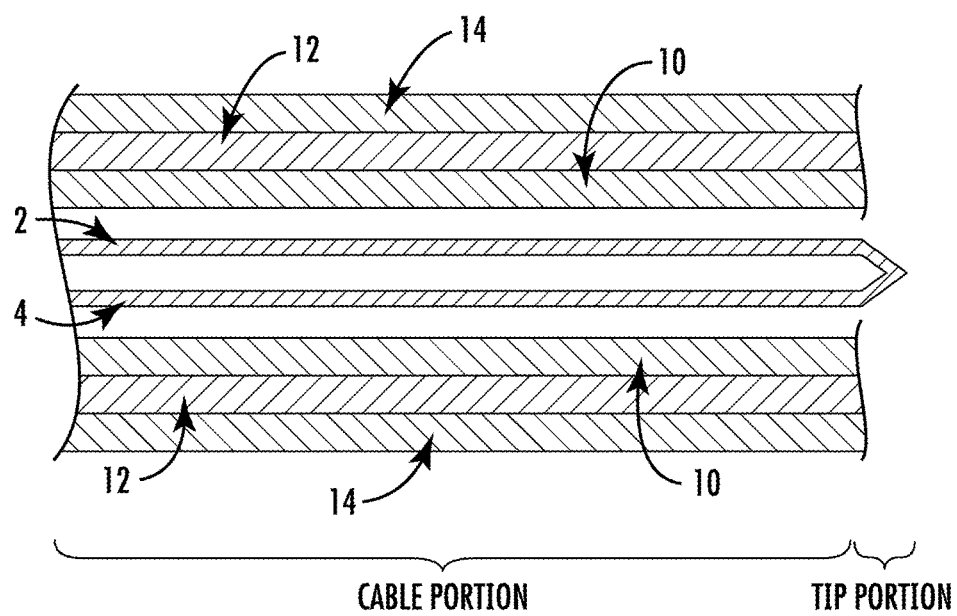
FIG. 3B is a schematic longitudinal section of the thermocouple according to the third embodiment of the invention, schematically showing the tip portion of the thermocouple.

FIGS. 3A and 3B are a transverse section and longitudinal section, respectively, of a thermocouple having a similar structure to the thermocouple of FIG. 1. Reference numerals corresponding to those in FIG. 1 will therefore be used. The thermocouple of FIG. 3 comprises two thermoelements 2, 4 extending within a composite sheath 6 comprising an inner sheath 10 and an outer sheath 12. Along the length of the thermocouple, the thermoelements are insulated from the inner sheath and from each other by an insulating ceramic material 8. The outer surface of the outer sheath is coated with a layer of a nickel-aluminide or a platinum-doped nickel-aluminide 14 of thickness approximately 100 to 200 micrometers. Alternatively, the outer surface of the outer sheath can be coated by chromizing. The coating enhances the oxidation resistance of the outer sheath.

The nickel-aluminide or platinum-doped nickel-aluminide coating, or the coating produced by chromizing, is particularly effective in combination with the outer sheath, in providing an oxidation-resistant and protective sheath for the thermocouple. The outer sheath is typically made of a nickel-chromium alloy or nickel-chromium-aluminum alloy and the coating bonds well to these alloys. The coating is typically more expensive than a nickel-chromium alloy sheath material and therefore is advantageously selectively used to coat only the portion of the thermocouple which will be exposed to elevated temperatures during use, i.e. the portion of the thermocouple sheath close to the junction between the thermoelements.

We claim:

1. A thermocouple, comprising:
a metal alloy outer sheath;
a first thermoelement,
wherein the first thermoelement extends within the metal alloy outer sheath;
a second thermoelement,
wherein the second thermoelement extends within the metal alloy outer sheath; and
a nickel-based inner sheath containing less than 10 wt % chromium,
wherein the nickel-based inner sheath contains greater than 90 wt % nickel, and
wherein the nickel-based inner sheath is positioned between the first thermoelement and the metal alloy outer sheath.

2. The thermocouple according to claim 1,
wherein the nickel-based inner sheath contains greater than 99 wt % nickel.

3. The thermocouple according to claim 1,
wherein the nickel-based inner sheath is formed from Nickel 270.

4. The thermocouple according to claim 1,
wherein the nickel-based inner sheath contains less than 5 wt % chromium.

5. The thermocouple according to claim 1,
wherein the nickel-based inner sheath contains less than 0.1 wt % chromium.

6. The thermocouple according to claim 1,
wherein the nickel-based inner sheath contains less than 0.2 wt % manganese.
7. The thermocouple according to claim 1,
wherein the nickel-based inner sheath contains less than 0.01 wt % manganese.
8. The thermocouple according to claim 1,
wherein the metal alloy outer sheath and the nickel-based inner sheath are in a form of coaxial tubes.
9. The thermocouple according to claim 8,
wherein the thermocouple further comprises:
an insulating material positioned:
(i) between the first thermoelement and the second thermoelement;
(ii) between the first thermoelement and an inner surface of the nickel-based inner sheath; and
(iii) between the second thermoelement and the inner surface of the nickel-based inner sheath,
such that:
(a) the first thermoelement and the second thermoelement are insulated from each other;
(b) the first thermoelement is insulated from the inner surface of the nickel-based inner sheath; and
(c) the second thermoelement is insulated from the inner surface of the nickel-based inner sheath.
10. The thermocouple according to claim 1,
wherein the metal alloy outer sheath is in contact with the nickel-based inner sheath.
11. The thermocouple according to claim 1,
wherein the thermocouple further comprises:
a second nickel-based inner sheath containing less than 10 wt % chromium,
wherein the second nickel-based inner sheath is positioned between the second thermoelement and the metal alloy outer sheath.
12. The thermocouple according to claim 11,
wherein the thermocouple further comprises:
an insulating material positioned:
(i) between the first thermoelement and an inner surface of the nickel-based inner sheath;
(ii) between the second thermoelement and an inner surface of the second nickel-based inner sheath;
(iii) between an outer surface of the nickel-based inner sheath and an outer surface of the second nickel-based inner sheath;
(iv) between the outer surface of the nickel-based inner sheath and an inner surface of the metal alloy outer sheath; and
(v) between the outer surface of the second nickel-based inner sheath and the inner surface of the metal alloy outer sheath,
such that:
(a) the first thermoelement is insulated from the inner surface of the nickel-based inner sheath;
(b) the second thermoelement is insulated from the inner surface of the second nickel-based inner sheath;
(c) the outer surface of the nickel-based inner sheath is insulated from the outer surface of the second nickel-based inner sheath;
(d) the outer surface of the nickel-based inner sheath is insulated from the inner surface of the metal alloy outer sheath; and
(e) the outer surface of the second nickel-based inner sheath is insulated from the inner surface of the metal alloy outer sheath.
13. The thermocouple according to claim 1,
wherein the first thermoelement is formed from Ni alloys, and
wherein Ni is the largest component by weight of the Ni alloys.
14. The thermocouple according to claim 1,
wherein at least a portion of an outer surface of the metal alloy outer sheath is coated with an intermetallic or is coated using chromizing.
15. The thermocouple according to claim 14,
wherein the at least a portion of the outer surface of the metal alloy outer sheath is coated with the intermetallic, and
wherein the intermetallic is a nickel-aluminide or platinum-doped nickel-aluminide.
16. The thermocouple according to claim 1,
wherein the nickel-based inner sheath is adapted to prevent diffusion of contaminants, which if absorbed by the first thermoelement would change a Seebeck coefficient of the first thermoelement, from the metal alloy outer sheath to the first thermoelement, along the thermocouple, during exposure of the thermocouple to temperatures above 1000° C.
17. The thermocouple according to claim 16,
wherein the nickel-based inner sheath has a thickness between 300 and 500 micrometers.
18. The thermocouple according to claim 16,
wherein the metal alloy outer sheath contains:
(i) manganese;
(ii) chromium; or
(iii) manganese and chromium, and
wherein the nickel-based inner sheath is adapted to:
(a) prevent diffusion of manganese:
(b) prevent diffusion of chromium; or
(c) prevent diffusion of manganese and chromium,
respectively, from the metal alloy outer sheath to the first thermoelement, along the thermocouple, during exposure of the thermocouple to temperatures above 1000° C.
19. The thermocouple according to claim 1,
wherein the thermocouple is configured to prevent oxidation of the first thermoelement and the second thermoelement when the thermocouple is operated in an oxidizing environment above 1000° C.
20. The thermocouple according to claim 1,
wherein the metal alloy outer sheath is formed of an oxidation-resistant metal alloy.
21. A method of measuring a temperature, comprising:
providing a thermocouple,
wherein the thermocouple comprises:
a metal alloy outer sheath;
a first thermoelement,
wherein the first thermoelement extends within the metal alloy outer sheath;
a second thermoelement,
wherein the second thermoelement extends within the metal alloy outer sheath; and
a nickel-based inner sheath containing less than 10 wt % chromium,
wherein the nickel-based inner sheath contains greater than 90 wt % nickel, and
wherein the nickel-based inner sheath is positioned between the first thermoelement and the metal or metal alloy outer sheath;
interconnecting the thermocouple to an object;
exposing the thermocouple to an oxidizing environment at a temperature above 1000° C;
receiving a voltage from the thermocouple; and determining a measured temperature of the object via the voltage.

22. A method for fabricating a thermocouple,
wherein the thermocouple comprises:
- a metal alloy outer sheath;
- a first thermoelement,
  wherein the first thermoelement extends within the metal alloy outer sheath;
- a second thermoelement,
  wherein the second thermoelement extends within the metal alloy outer sheath; and
- a nickel-based inner sheath containing less than 10 wt % chromium,
  wherein the nickel-based inner sheath contains greater than 90 wt % nickel, and
  wherein the nickel-based inner sheath is positioned between the first thermoelement and the metal alloy outer sheath, and wherein the method comprises: forming the metal alloy outer sheath and the nickel-based inner sheath simultaneously by coextrusion or swaging.

\* \* \* \* \*